United States Patent
Ina

[11] Patent Number: 6,132,939
[45] Date of Patent: Oct. 17, 2000

[54] METHOD FOR FORMING PHOTORESIST PATTERN

[75] Inventor: Katsuyoshi Ina, Iwakura, Japan

[73] Assignee: Sharp Kabushiki Kaisha, Osaka, Japan

[21] Appl. No.: 09/131,698

[22] Filed: Aug. 10, 1998

[30] Foreign Application Priority Data

Sep. 24, 1997 [JP] Japan ................................. 9-258258

[51] Int. Cl.⁷ ................................................ G03C 5/00
[52] U.S. Cl. ..................... 430/325; 430/271.1; 430/273.1
[58] Field of Search .................................... 430/322, 325, 430/271.1, 273.1, 311, 961; 427/96, 155

[56] References Cited

U.S. PATENT DOCUMENTS

| | | | |
|---|---|---|---|
| 4,977,036 | 12/1990 | Baldi | 428/553 |
| 5,707,784 | 1/1998 | Oikawa et al. | 430/325 |
| 5,962,196 | 10/1999 | Das et al. | 430/330 |

FOREIGN PATENT DOCUMENTS 07295228  11/1995  Japan .

*Primary Examiner*—S. Rosasco
*Attorney, Agent, or Firm*—Nixon & Vanderhye

[57] ABSTRACT

A method for forming a resist pattern comprising the steps of: exposing a chemically amplified resist film by use of a mask having a given pattern; forming a protective film made of a paraffin having a melting point of not higher than 10° C. and a boiling point of not lower than 50° C. on the surface of the chemically amplified resist film before or after exposing the chemically amplified resist film; and forming the given pattern in the chemically amplified resist film by developing.

6 Claims, 2 Drawing Sheets

(a)

(b)

(c)

(d)

(e)

1

METHOD FOR FORMING PHOTORESIST PATTERN

CROSS-REFERENCE TO RELATED APPLICATIONS

This application is related to Japanese patent application No.Hei 9(1997)-258258, filed on Sep. 24, 1997 whose priority is claimed under 35 USC § 119, the disclosure of which is incorporated herein by reference in its entirety.

BACKGROUND OF THE INVENTION

1. Field of the Invention

The present invention relates to a method for forming a photoresist pattern using a chemically amplified resist.

2. Related Arts

Large scale integrated circuits (hereinafter referred to as "LSI") are integrated higher and higher every year, so that a size reduction of the circuits under the design rule thereof is required more. Further, a light source used in a photolithography process has been shifted from an i-line (wavelength 365 nm) to a KrF (wavelength 248 nm) excimer laser and then to an ArF (wavelength 193 nm) excimer laser.

Generally, a chemically amplified resist to be able to photosensitive by using an excimer laser comprises a resin as a main component and a photosensitizer which generates a strong acid by exposure of the excimer laser light. The acid generated by exposure cuts a side chain of the resin and, at the same time, acts the photosensitizer which is not exposed yet to chain-react for generating more acid. Cutting the side chain of the resin and generating the acid, which are induced by the heat treatment (PEB: post-exposure baking) in succession, make a soluble region and an insoluble region against a developer.

As mentioned above, it is necessary for the chemically amplified resist, in consideration of its nature, to generate the strong acid in the case of light exposure. However, its acid is apt to be neutralized by moisture, ammonia or the like in the air to be deactivated during the time before shifting from the exposure to the PEB process (hereafter, required time before the PEB process after the exposure is referred to as "delay") as shown in FIG. 2(a). As a result, the content of acid is low in the surface of the resist. Accordingly, as for a positive resist, a surface thereof becomes slightly soluble in the developer, so that T-shape patterns are formed on its surface as shown in FIG. 2(b). As for a negative resist, a surface thereof is apt to be soluble in the developer.

FIGS. 2(a) and 2(b) are figures served for explaining problems in the conventional technique. In FIGS. 2(a) and 2(b), reference numeral 21 represents a substrate to be etched, 22 represents a chemically amplified resist film and 23 represents a resist pattern.

In order to prevent this deactivation of the acid, a process control with as short delay as possible, an environmental cleaning by means of a chemical filter, an overcoat of a strong acid aqueous solution and the like have been considered. Further, Unexamined Japanese Patent Publication No. Hei 7(1995)-295228 proposes another way besides the above-mentioned these ways.

Hereafter, a forming process for a photoresist pattern disclosed in the above Patent Publication is described with reference to FIGS. 3(a) to 3(e).

First, a chemically amplified resist is applied on a semiconductor substrate 31 by means of the spin coating method to form a chemically amplified resist film 33 on the semiconductor substrate 31 (FIG. 3(a)). Next, a protective film 35 made of an organic material (e.g., polyethylene or an acidic polymer) is made on the chemically amplified resist film 33. This protective film 35 plays a role of protecting a catalyst (for example, an acid) from any factor, which will deactivate the catalyst, existing in the air keeping the exposed sample, the catalyst being generated at the exposed part of the chemically amplified resist film 33 on the case of exposing the same (FIG. 3(b)). Then, the chemically amplified resist film 33 is selectively exposed through the protective film 35 (FIG. 3(c)). After peeling the protective film 35, the substrate 31 is subjected to a bake treatment after exposure (FIG. 3(d)). After that, a photoresist pattern is formed by developing (FIG. 3(e)). Also, this Patent Publication has proposed a method for forming a protective film on a resist after exposure.

However, a throughput which a developing apparatus can develop is limited. That is, an about one hour delay is essential until a final treatment of lots. During this delay time, the acid is deactivated. The chemical filter is especially effective in reducing a concentration of ammonia inside the apparatus but not enough effective in dehydrating. Further, maintenance such as the filter exchange is timely necessary. On the other hand, the overcoat of the strong acid aqueous solution is excellent in its surroundings. However, it has a fateful drawback such that the acid to be used is so strong as pH2 to 3 that the apparatus, especially metal inside the applying apparatus is apt to be corroded by the acid.

A method disclosed in Japanese Unexamined Patent Publication No. Hei 7(1995)-295228 uses the protective film 35 made of polyethylene in order to protect deactivation of the acid, so that another process of removing the protective film is necessary. This is because a solvent used for removing the protective film 35 is a solvent of an aromatic compound such as benzene and different form a developer, such as an alkaline aqueous solution, to be used in a usual resist process.

On the other hand, by using the developer of the aromatic compound such as benzene, the protective film 35 can be removed at the same time of developing. However, by this method, usage of the developer increases and then, there arises a problem such as a bad influence to the environment. In the case of using an acidic polymer as a protective film, there is the same problem as in the case of using the strong acid aqueous solution, such that metal inside the applying apparatus is apt to be corroded by the acid.

SUMMARY OF THE INVENTION

An object of the present invention is to provide a method for forming a photoresist pattern using such a chemically amplified resist that is able to photosensitize to an excimer laser such as KrF (wavelength 248 nm) and ArF (wavelength 193 nm), an X-ray, an electron beam or the like and that is able to protect an acid from deactivation under any circumstance after exposure in the case of forming an LSI pattern.

Thus, the present invention provides a method for forming a resist pattern comprising the steps of: exposing a chemically amplified resist film by use of a mask having a given pattern; forming a protective film made of a paraffin having a melting point of not higher than 10° C. and a boiling point of not lower than 50° C. on the surface of the chemically amplified resist film before or after exposing the chemically amplified resist film; and forming the given pattern in the chemically amplified resist film by developing.

DETAILED DESCRIPTION OF THE PREFERRED EMBODIMENTS

Figure 1A:
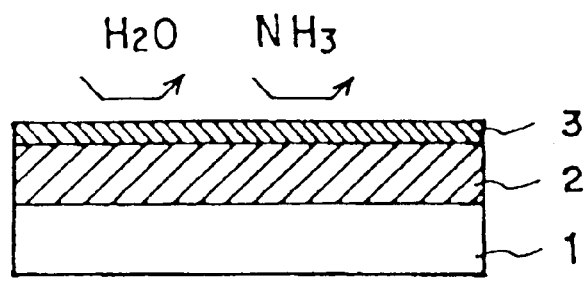
FIGS. 1(a) and 1(b) are schematic sectional views illustrating forming processes for a resist pattern of an embodiment of the present invention.
Figure 1B:
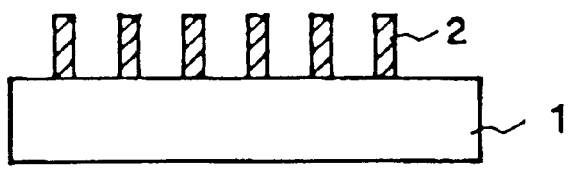

FIGS. 1(a) and 1(b) are schematic sectional views illustrating forming processes for a photoresist pattern of an embodiment of the present invention. In FIGS. 1(a) and 1(b), reference numeral 1 represents a substrate to be etched, 2 represents a chemically amplified resist film and 3 represents a protective film made of the the paraffin having a boiling point of not lower than 50° C. and a melting point of not higher than 10° C.

As shown in FIG. 1(a), since the surface of the resist film is covered with the protective film, the protective film can prevent the surface of the resist film from contacting $H_2O$, $NH_3$ and the like in the air. Therefore, an acid at an exposed region of the resist film is not deactivated. Accordingly, as shown in FIG. 1(b), a photoresist pattern having a good form can be formed.

According to the present invention, the boiling point and the melting point of the paraffin to be used are suitably not lower than 50° C. and not higher than 10° C., respectively. The paraffin to be used preferably has such a property that the protective film can coat uniformly and quickly the resist film and moreover, protect stably the resist film for a long time. As the boiling point and the melting point of the paraffin increase, i.e., an average molecular weight of the paraffin increases, the paraffin hardly evaporates after forming the protective film, so that the protective film becomes stable. However, it is not preferred that a thickness of the protective film tends to be uneven and the protective film itself becomes too thick when the melting point of the paraffin is too high (melting point of not lower than 10° C.), so that a viscosity of the paraffin is too high.

On the other hand, if the boiling point and the melting point thereof are low, i.e., the average molecular weight of the paraffin is small, the protective film made of the paraffin coats thinly and uniformly with ease. However, if the boiling point thereof is too low (boiling point of not higher than 50° C.), it is not preferred that after forming the protective film, the paraffin is easy to evaporate in the air at short time, so that separation of the resist film and the air is not enough. The average molecular weight of the paraffin is preferably 60 to 200.

As for the chemically amplified resist, either a positive type or a negative type thereof can be used. In the present invention, the chemically amplified resist is defined as a mixture of a base resin and a photosensitizer which is decomposed by exposure to generate an acid.

Specific examples of the base resin include phenolic resins, novolak resins, polyvinyl pyrrolidone resins, styrene resins and the like. Specific examples of the photosensitizer include onium salt compounds, naphtoquinone diazide compounds, non-benzophenone compounds, nitrobenzyl ester compounds and the like. However, these mixtures are simply examples and additionally, any chemically amplified resist being used in the art can be used besides these. Moreover, a commercially available chemically amplified resist, e.g., K2G (manufactured by Japan Synthetic Rubber Co., Ltd), TDUR-P009 (manufactured by Tokyo Ohka Kogyo Co., Ltd), TDUR-P015 (manufactured by Tokyo Ohka Kogyo Co., Ltd) or the like can be used.

A method for forming the chemically amplified resist film is not especially limited. For example, the chemically amplified resist film may be formed on a wafer by using a coating apparatus such as a spin coater. The resist film is usually made to a thickness of 0.3 to 1.0 $\mu$m.

After coating, the resist film is preferably subjected to a heat-treatment at a temperature of 70 to 120° C. to remove a solvent component in the resist film. This heat-treatment is usually called as "prebake (PB)".

Next, on the resist film, a given pattern is exposed by using a light source, e.g., an i-line, a KrF excimer laser, an ArF excimer laser or the like through a mask having the given pattern. The resist film together with the protective film is subjected to the PEB process.

The protective film of the present invention is mostly removed in the PEB process and then, washed away together with a developer during a treatment with the developer. Therefore, the chemically amplified resist film can be formed and treated by using the conventional coating apparatus and developing apparatus without any special apparatus. The PEB treatment is preferably conducted heating at a temperature of 90 to 150° C.

The molecular weight and structure of the paraffin uniquely determine the boiling point and the melting point thereof.

In the present invention, the paraffin having a straight-chain structure or a branched-chain structure represented by the general formula $C_nH_{2n+2}$ (n is an integer between 5 to 14) can be used singly or as a mixture thereof. Specific examples of the paraffin include n-paraffins (e.g. n-pentane, n-hexane, n-heptane, n-octane, n-nonane, n-decane, n-undecane, n-dodecane, n-tridecane and n-tetradecane) and iso-paraffins (e.g. iso-pentane, 2-methylpentane, 3-methylpentane, 2,3-dimethylbutane, 2-methylhexane, 3-methylhexane, 3-ethylpentane, 2,2-dimethylpentane, 2,3-dimethylpentane, 2,4-dimethylpentane, 3,3-dimethylpentane, 2,2,3-trimethylbutane, 2-methylheptane, 3-methylheptane, 2,2-dimethylhexane, 2,3-dimethylhexane, 2,5-dimethylhexane, 3,4-dimethylhexane, 2,2,3-trimethylpentane, 2,2,4-trimethylpentane, 2,3,3-trimethylpentane, 2,3,4-trimethylpentane, 2-methyloctane, 2-methylnonane). The paraffin is a completely nonpolar material since the paraffin consists of only carbon atoms (C) and hydrogen atoms (H). Therefore, the paraffin has a function of repelling a polar material such as water. Accordingly, the protective film can completely isolate the acid in the resist film from the open air, so that it can prevent the acid form being deactivated.

Forming the protective film may be conducted any time after forming the resist film or after exposing. In the case of forming the protective film of the paraffin before exposing, a content of chlorine is preferably as low as possible since the paraffin is easy to be decomposed when being exposed if chlorine exists in the paraffin. In the case of forming the protective film of the paraffin after forming the resist film, the protective film is preferably formed after coating the resist film on a wafer to form by a spin coater and removing a solvent component in the resist film by the heat-treatment (PB: prebake). Further, in the case of forming the protective film of the paraffin after exposing, the protective film is preferably formed as soon as possible after exposing to prevent deactivating the acid. A thickness of the protective film is preferably 0.01 to 1.5 $\mu$m. It would be difficult to expose the resist film and remove the protective film if the thickness thereof is more than 1.5 $\mu$m. On the other hand, if the thickness thereof is less than 0.01 $\mu$m, it would be difficult to protect the acid from deactivation.

The method of the present invention can be applied to any kind of what is called chemically amplified resist films as long as the resist film generates an acid and then, induces amplification of the acid in the PEB process.

EXAMPLES

Example 1

First, a single crystal silicon wafer of 6 inches was washed with a diluted hydrofluoric acid (DHF) solution and then, dried at a high temperature to pre-treat the surface of the wafer. Next, the surface thereof was made lipophilic with hexamethyldisilazane (HMDS). Then, the resist film was made by coating a positive chemically amplified resist (K2G, manufactured by Japan Synthetic Rubber Co., Ltd.) by means of the spin coating method and then, subjected to the PB treatment at 100° C. for 90 seconds. A thickness of the resist film after coating was 0.8 μm.

Next, a commercially available liquid paraffin having a boiling point of about 90° C. and a melting point of about −90° C. (DOSB, manufactured by Shell Chemical Co.,) was coated thereon to a film thickness of 0.01 μm to form a protective film by means of the above spin coating method (FIG. 1(a)). For comparison, a wafer which was not coated with the paraffin was prepared.

Then, a line/space (L/S) pattern having a mask size of 0.25 μm was exposed thereon by using a KrF excimer laser exposing apparatus (NSR-1755 EX-8, manufactured by Nikon corporation). After exposing followed by leaving in the air for 1 hour, the wafer was subjected to the PEB treatment at 105° C. for 90 seconds, cooled and then, promptly immersed in a developer to wash away a soluble part of the resist film. Then, again the bake treatment was conducted at 110° C. for 90 seconds to evaporate completely the developer on the wafer.

Figure 2A:
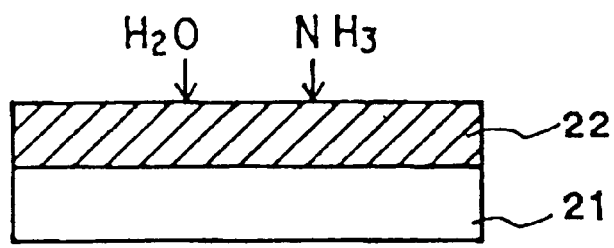
FIGS. 2(a) and 2(b) are schematic sectional views to be used for explaining a problem of a conventional technique.
Figure 2B:
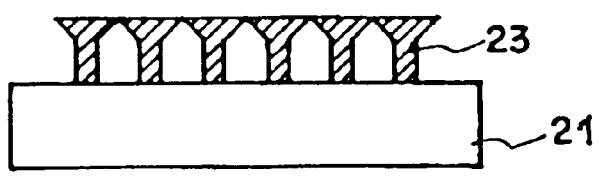
Figure 3A:
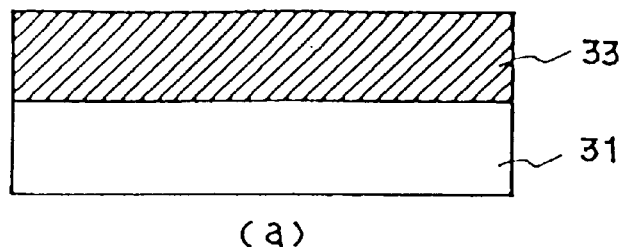
FIGS. 3(a) to 3(e) are schematic sectional views illustrating forming processes for a resist pattern of the conventional technique.
Figure 3B:
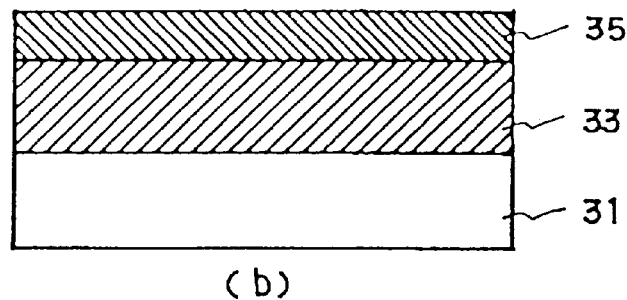
Figure 3C:
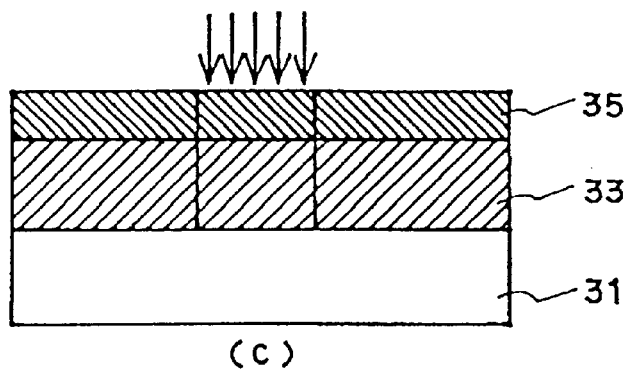
Figure 3D:
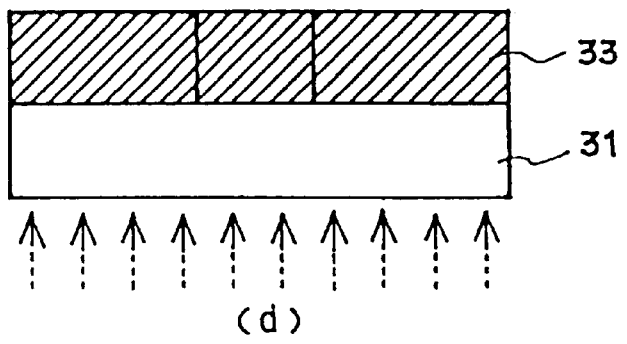
Figure 3E:
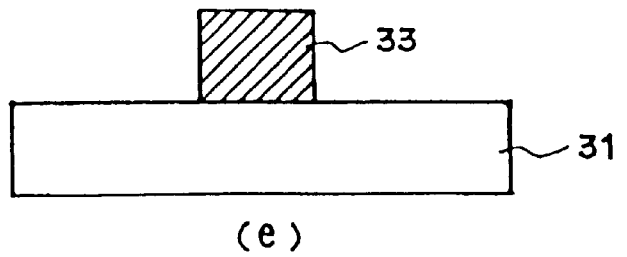

A cross section of the resist film pattern-formed as mentioned above was observed by means of an electron microscope. As a result, a cross section of the resist film which was not coated with the paraffin indicated a shape of T-top as shown in FIG. 2(b) because of deactivating the acid on the surface during a delay of 1 hour. On the other hand, a cross section of the resist film which was coated with the paraffin indicated that a crowded line (L/S) pattern of 0.25 μm was formed clearly as shown in FIG. 1(b).

Example 2

First, wafers whose surfaces were treated with dilute hydrofluoric acid and hexamethyldisilazane were prepared as described in Example 1. Then, a resist film was formed by coating a positive chemically amplified resist (TDUR-P009, manufactured by Tokyo Ohka Kogyo Co., Ltd.) and then, subjected to the PB treatment at 90° C. for 90 seconds. A thickness of the film after coating was 0.7 μm.

Then, an L/S pattern having a mask size of 0.22 μm was exposed thereon by using a KrF laser exposing apparatus (FPA-3000 EX3, manufactured by Canon Inc.). A protective film was formed by promptly coating with a liquid paraffin (reagent) having a boiling point of about 140° C. and a melting point of about 0° C. to a film thickness of 1 μm after exposing. For comparison, a wafer which was not coated with the paraffin was prepared.

Next, after leaving in the air for 3 hours, the wafer was subjected to the PEB treatment at 110° C. for 90 seconds and then, subjected to the developing treatment and the bake treatment as described in Example 1.

As the same as in Example 1, a cross section of the resist film which was not coated with the paraffin indicated a shape of T-top whose upper part was wider than the lower part. On the other hand, a cross section of the resist film which was coated with the paraffin having a boiling point of not lower than 50° C. and a melting point of not higher than 10° C. indicated that an L/S pattern of 0.221 μm was formed clearly.

Example 3

First, wafers whose surfaces were treated with a dilute hydrofluoric acid and hexamethyldisilazane were prepared as described in Example 1. Then, a resist film was formed by coating a positive chemically amplified resist (TDUR-P015, manufactured by Tokyo Ohka Kogyo Co., Ltd.) and then, subjected to the PB treatment at 90° C. for 90 seconds. A thickness of the film after coating was 0.7 μm. Then, a protective film was formed by coating with the paraffin having the boiling point and the melting point as shown in Table 1.

Then, an L/S pattern having a mask size of 0.3 μm was exposed thereon by using the KrF laser exposing apparatus (FPA-3000 EX3, manufactured by Canon Inc.).

Next, after leaving in the air for 3 hours, the wafer was subjected to the PEB treatment at 100° C. for 90 seconds and then, subjected to the developing treatment and the bake treatment as described in Example 1.

The result is shown in Table 1. As shown in Table 1, it can be seen that the cross-sectional shape of the resist film is good in the case of the paraffin having the boiling point of not lower than 50° C. and the melting point of not higher than 10° C.

TABLE 1

| No. | Components (wt %) | Cross section of the resist | Boiling point (° C.) | Melting point (° C.) | Film thickness (μm) |
|---|---|---|---|---|---|
| 1 | pentane (55) hexane (45) | good | 50 | −110 | 0.01 |
| 2 | undecane (20) dodecane (80) | good | 220 | 10 | 1.5 |
| 3 | hexane (100) | good | 67 | −9.5 | 0.012 |
| 4 | undecane (100) | good | 210 | 2 | 1.3 |
| 5 | pentane (90) hexane (10) | T-top | 40 | −120 | 0.005 |
| 6 | dodecane (30) tridecane (70) | inconsistent | 230 | 20 | 2.0 |
| 7 | undecane (30) dodecane 70 | inconsistent | 220 | 15 | 1.5 |

As shown in Table 1, it could be seen that the sectional shape of the resist film was good in the case of the paraffin having the boiling point of not lower than 50° C. and the melting point of not higher than 10° C. (Nos. 1 to 4). In the case of the entry No. 5, the paraffin was evaporated before the PEB treatment since the boiling point of the paraffin was not higher than 50° C. In the case of the entries Nos. 6 and 7, the paraffin could not coat uniformly since the melting points of the paraffin were not lower than 10° C.

As mentioned above in detail, according to the present invention, using the conventional spin coating apparatus and developing apparatus, an acid generated after exposing a chemically amplified resist which is able to expose to an excimer laser such as KrF (248 nm) and ArF (193 nm), an X-ray, an electron beam or the like can be prevented from being deactivated for a long time. Thereby, shortening processes thereof is possible.

What is claimed is:

1. A method for forming a resist pattern comprising the steps of:

exposing a chemically amplified resist film by use of a mask having a given pattern;

forming a protective film made of a paraffin having a melting point of not higher than 10° C. and a boiling point of not lower than 50° C. on the surface of the chemically amplified resist film before or after exposing the chemically amplified resist film; and forming the given pattern in the chemically amplified resist film by developing.

2. The method of claim 1, wherein the paraffin has a weight-average molecular weight of 60 to 200.

3. The method of claim 1, wherein the paraffin is a compound represented by the general formula $C_nH_{2n+2}$ in which n is an integer between 5 to 14.

4. The method of claim 1, wherein the paraffin is selected from the group consisting of n-pentane, n-hexane, n-heptane, n-octane, n-nonane, n-decane, n-undecane, n-dodecane, n-tridecane, n-tetradecane, iso-pentane, 2-methylpentane, 3-methylpentane, 2,3-dimethylbutane, 2-methylhexane, 3-methylhexane, 3-ethylpentane, 2,2-dimethylpentane, 2,3-dimethylpentane, 2,4-dimethylpentane, 3,3-dimethylpentane, 2,2,3-trimethylbutane, 2-methylheptane, 3-methylheptane, 2,2-dimethylhexane, 2,3-dimethylhexane, 2,5-dimethylhexane, 3,4-dimethylhexane, 2,2,3-trimethylpentane, 2,2,4-trimethylpentane, 2,3,3-trimethylpentane, 2,3,4-trimethylpentane, 2-methyloctane and 2-methylnonane, or a mixture thereof.

5. The method of claim 1, wherein the protective film is formed after exposing the chemically amplified resist film.

6. The method of claim 1, wherein the protective film has a thickness of 0.01 to 1.5 μm.

* * * * *